United States Patent
Yang et al.

(10) Patent No.: US 9,313,873 B1
(45) Date of Patent: Apr. 12, 2016

(54) MODULAR ELECTRODE DEVICE

(71) Applicant: Institute of Nuclear Energy Research Atomic Energy Council, Executive Yuan, Taoyuan County (TW)

(72) Inventors: Kuo-Hui Yang, Kaohsiung (TW); Chen-Der Tsai, Hsinchu County (TW); Ying-Fang Chang, Hsinchu (TW); Chen-Chung Du, Hsinchu (TW); Chih-Chiang Weng, Taoyuan County (TW)

(73) Assignee: INSTITUTE OF NUCLEAR ENERGY RESEARCH ATOMIC ENERGY COUNCIL, EXECUTIVE YUAN, Taoyuan County (TW)

( * ) Notice: Subject to any disclaimer, the term of this patent is extended or adjusted under 35 U.S.C. 154(b) by 0 days.

(21) Appl. No.: 14/582,497

(22) Filed: Dec. 24, 2014

(30) Foreign Application Priority Data

Nov. 21, 2014 (TW) .............................. 103140493 A (51) Int. Cl.
*H01J 17/26* (2012.01)
*H05H 1/48* (2006.01)

(52) U.S. Cl.
CPC ........................................ *H05H 1/48* (2013.01)

(58) Field of Classification Search
CPC .............................. H01L 2924/00; H05H 1/48
USPC ........................................ 313/231.41, 231.31
See application file for complete search history.

(56) References Cited

U.S. PATENT DOCUMENTS

| 8,257,860 | B2* | 9/2012 | Jeon | H01M 2/1016 |
| | | | | 429/152 |
| 8,329,326 | B2* | 12/2012 | Suto | H01G 9/016 |
| | | | | 429/149 |
| 8,373,088 | B2 | 2/2013 | Kang | |
| 2006/0102196 | A1 | 5/2006 | Kurunczi | |
| 2006/0156983 | A1 | 7/2006 | Penelon et al. | |

(Continued)

FOREIGN PATENT DOCUMENTS

| TW | M291804 | 6/2006 |
| TW | I262625 | 9/2006 |
| TW | M454463 | 6/2013 |

OTHER PUBLICATIONS

Claire Tendero et al., "Atmospheric pressure plasmas: A review", Nov. 2005.
Tetsuji Shimizu et al., "Characterization of Microwave Plasma Torch for Decontamination", Mar. 2008.

(Continued)

*Primary Examiner* — Vip Patel
(74) *Attorney, Agent, or Firm* — WPAT, PC; Justin King (57) ABSTRACT

A modular electrode device comprises a plurality of main bodies, a first electrode, at least one second electrode, at least one first connecting member and two second connecting members. Each main body has a side edge, an internal chamber and a gas inlet communicative in space between the chamber and the atmosphere. The first electrode is mounted at the side edge of one main body, while the in-serial second electrodes connected to one end of the first electrode are mounted at the side edges of the other main bodies. The main bodies are separated by the parallel third electrodes. The third, the second and the third electrodes are connected to each other. The first connecting member bridges in-serially the first electrode and the neighboring second electrode. The second connecting members are applied to both opposing end of the in-serial combination of the first and the second electrodes.

11 Claims, 10 Drawing Sheets

(56) References Cited

U.S. PATENT DOCUMENTS

2009/0068375 A1 3/2009 Dobbyn et al.
2013/0026137 A1 1/2013 Kindel et al.

OTHER PUBLICATIONS

Feidhlim T. O'Neil et al., "Generation of Active Species in a Large Atmospheric-Pressure Plasma Jet", Nov. 2012.

Volkmar Hopfe et al., "Linear Extended ArcJet-CVD—a New PECVD Approach for Continuous Wide Area Coating Under Atmospheric Pressure," Jan. 2005.

R Rahul et al., "Optical and RF electrical characteristics of atmospheric pressure open-air hollow slot microplasmas and application to bacterial inactivation", May 2005.

L. Bardos et al., "Radio frequency hollow cathode source for large area cold atmospheric plasma applications", Nov. 2000.

* cited by examiner

MODULAR ELECTRODE DEVICE

CROSS REFERENCE TO RELATED APPLICATION

The present application is based on, and claims priority from, Taiwan (International) Application Serial Number 103140493, filed on Nov. 21, 2014, the disclosure of which is hereby incorporated by reference herein in its entirety.

TECHNICAL FIELD

The present disclosure relates to modular electrode device, and more particularly to the modular electrode device that can vary the applicable range of structures for linear plasma in a serial-arranged manner so as to be suitably applied to different base plates with various areas.

BACKGROUND

By compared to the vacuum plasma technology, the atmospheric pressure plasma operated under an atmosphere environment can work without an expensive vacuum chamber and the complicated vacuuming equipments, and thus the equipment investment thereupon can be greatly reduced. In addition, the atmospheric pressure plasma also has various advantages in no limitation upon the chamber size, being easily extendable, being highly applicable to the in-line process and so on. In particular, the atmospheric pressure plasma can be applied to various surface treatment of a base plate, such as cleaning, activating, etching, etc. Besides, the atmospheric pressure plasma can be also relevant to the coating by deposition for the base plates.

In the art, the mega linear plasma processing apparatus specifically for processing large-size base plates is featured in rapid processing for many applications such as surface cleaning, activating, reducing, coating and so on. In the market, facilities for processing the linear plasma are already provided by major manufacturers. Nevertheless, for manufacturing of the modularized linear-plasma apparatus needs a substantial amount of heat-resistant insulating material, and further for the large-size heat-resistant insulating material such as the 1-m PEEK, Teflon or Ceramics, is hard to obtain in the free market, the combined cost of the mega apparatus is high and kind of long way to be reduced. Further, in order to handle different sizes of mega base plates, it is infeasible to prepare many facilities with different capacities and varied structuring. In addition, the engineering of manufacturing a mega plasma facility is complicated in various practical manifolds. For example, in a plasma manufacturing process, the in-process temperature is significant to affect the deformation of the electrode. Therefore, a large amount of cooling water is usually supplied to the electrode so as to stabilize the temperature of the electrode. However, in practice, difficulty of constructing the channel for conveying the cooling water is raised as the increase of the length of the electrode.

In a patented technology, a plurality of parallel plasma source is arranged in a linear manner, and the corresponding electrodes are parallel connected, such that individual plasma sources can produce a series of parallel plasmas by introducing respective process gases. While in handling a mega base plate, the number of the electrode sources can be extended to meet the size requirement. However, such a construction of the modularized linear plasma apparatus would face a problem of uneven distribution of the plasma, and thus can only be applied to the manufacturing of the direct-type plasma.

In another disclosure, a plurality of parallel insulating pipes is arranged between two electrodes in a predetermined linear, circular or rectangular pattern. A series of plasmas are produced by introducing process gas into each of the insulating pipes. Through the serial connection of the insulating pipes, a patterned and mega application of plasma can be achieved. However, in such a technique, as long as the configuration and the size of the electrode is determined, the extension of the whole apparatus is no more possible. In addition, the resulted uneven distribution of the plasma can only be applied to the direct-type plasma.

SUMMARY

The present disclosure is to provide a modular electrode device. The modular electrode device comprises a plurality of main bodies, a first electrode, at least one second electrode, at least one first connecting member and two second connecting members. Each of the main bodies has a first side edge, a second side edge and a third side edge, in which the second side edge is disposed between the first side edge and the third side edge. The main body has an internal chamber and a gas inlet to communicate in space between the chamber and the atmosphere. The first electrode is mounted at the second side edge of one of the main bodies. The second electrodes connected in-serially to one end of the first electrode are mounted at the second side edges of the other main bodies. The plural main bodies are separated and shielded by the third electrodes. The third electrodes, the first electrode and the at least one second electrode are connected to each other. At least one first connecting member is used to connect in-serially the first electrode and the neighboring second electrode. Two second connecting members are applied to both opposing end of the in-serial combination of the first electrode and the at least one second electrode.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring now to FIG. 1 through FIG. 7, the modular electrode device 100 includes two main bodies 10, a first electrode 20, a second electrodes 30, three third electrodes 40, a first connecting member 50, two second connecting members 60, a plurality of beam bodies 70 and a plurality of lateral plates 80, in which the first electrode 20, the second electrodes 30, the third electrodes 40, the first connecting member 50 and the second connecting members 60 can all be made of the dielectric material.

Figure 7:
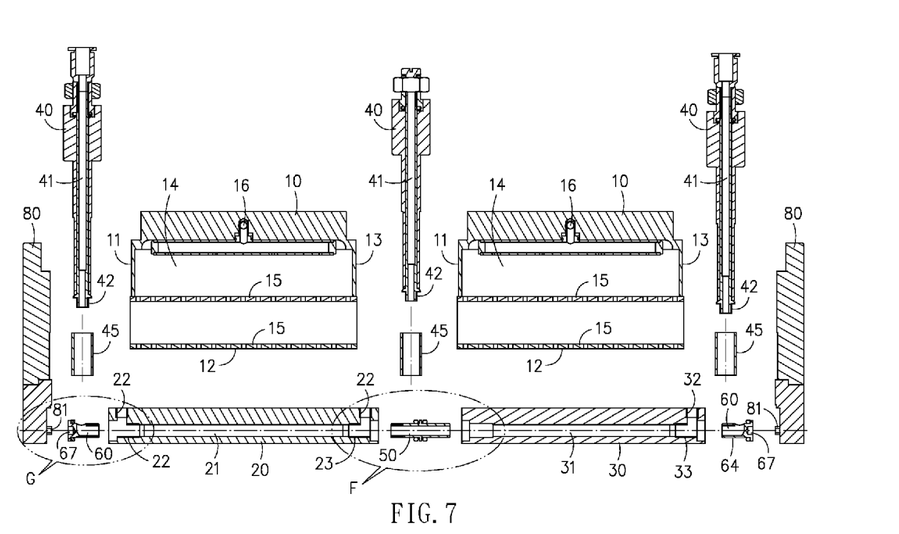
FIG. 7 is an exploded view of FIG. 4.

Referring to FIG. 7, the main body 10 has a first side edge 11, a second side edge 12 and a third side edge 13, in which the second side edge 12 is located between the first side edge 11 and the third side edge 13, the first side edge 11 is perpendicular to the second side edge 12, the second side edge 12 is perpendicular to the third side edge 13, and the first side edge 11 is substantially parallel to the third side edge 13. The main body 10 includes thereinside a chamber 14 and a plurality of porous diffusion plates 15. The main body 10 includes a gas inlet 16 communicative in space with the chamber 14 for introducing the process gas outside the main body 10 into the chamber 14. The process gas introduced to the chamber 14 is evenly distributed by the diffusion plates 15. In this disclosure, the position of the gas inlet 16 is not limited to top of the main body 10, and actually can be anywhere at the main body 10 per practical needs.

The first electrode 20 is mounted to the second side edge 12 of one of the main bodies 10 (in FIG. 7, the main body at the left hand side). The first electrode 20 further includes a first channel 21 extended longitudinally as a central through hole communicative in space to both opposing ends of the first electrode 20.

The second electrode 30 is mounted to the second side edge 12 of the neighboring main body 10 (in FIG. 7, the main body at the right hand side). The second electrode 30 further includes a second channel 31 extended longitudinally as a central through hole communicative in space to both opposing ends of the second electrode 30. As shown in FIG. 7, the second electrode 30 connects in series to one end of the first electrode 20.

As shown in FIG. 7, two main bodies 10 are separated and isolated at both sides thereof by three third electrodes 40. Each of the third electrodes 40 further includes a third channel 41 extended longitudinally as a central through hole communicative in space to both opposing ends of the third electrode 40, and is erected parallel to either the first side edge 11 or the third side edge 13 of the main body 10, in which the first side edge 11 and the third side edge 13 are parallel to each other. One end of the third electrode 40 is formed to have an external thread 42, while the pairing internal thread 22 or 32 is constructed to the first electrode 20 or the second electrodes 30 at a position corresponsive to the respective external thread 42 of the third electrode 40. The two third electrodes 40 aside to an individual main body 10 is located parallel to the first side edge 11 and the third side edge 13 of the main body 10. By having the distance between the two external threads 42 of the respective two third electrodes 40 equal to that between the two internal threads 22 at opposing ends of the same first electrode 20, the engagement of the external thread 42 and the corresponding internal thread 22 would be also realized as the engagement of the third electrode 40 and the first electrode 20. In FIG. 7, a sleeve member 45 is also included to each individual third electrode 40 for sleeving a lower portion of the corresponding third electrode 40 between the two diffusion plates 15.

Figure 8:
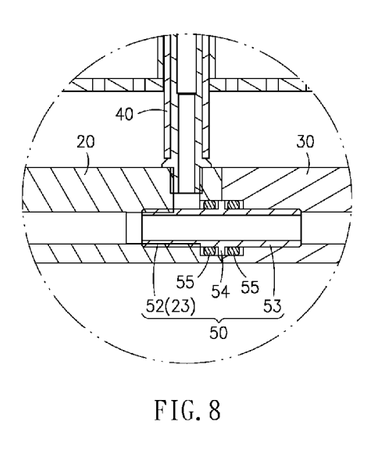
FIG. 8 is an enlarged view of area D of FIG. 4.
Figure 9:
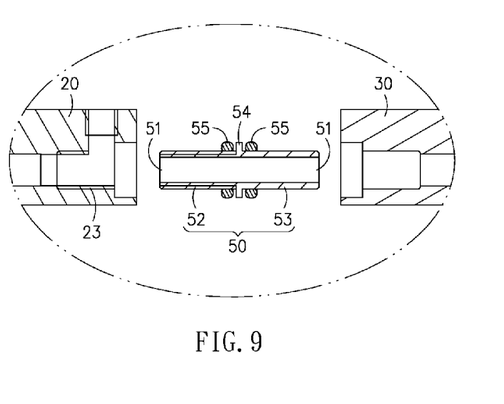
FIG. 9 is an enlarged view of area F of FIG. 7.

Referring now to FIG. 7 through FIG. 9, a first connecting member 50 located between the first electrode 20 and the second electrodes 30 is to connect the neighboring ends of the first electrode 20 and the second electrodes 30. The first connecting member 50 shaped as a hollow pipe section has two opposing first open ends 51, The two opposing first open ends 51 are to plug respectively the first electrode 20 and the second electrode 30. The two opposing ends of the first connecting member 50 are formed respectively an external threaded section 52 and a plug section 53. The threaded section 52 is to engage with the internal thread 23 of the first electrode 20, while the plug section 53 is to plug tightly into the second electrodes 30. In addition, the first connecting member 50 is externally encircled by a flange 54 and two washers 55.

Figure 10:
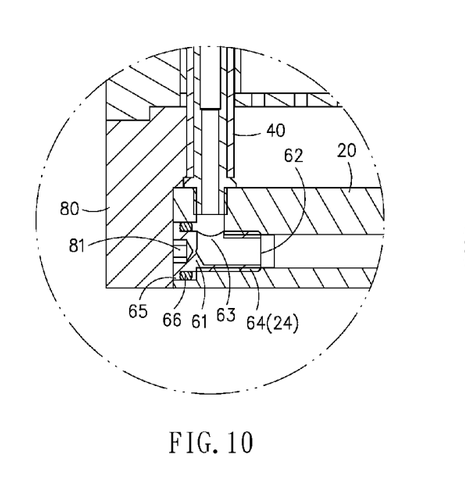
FIG. 10 is an enlarged view of area E of FIG. 4.
Figure 11:
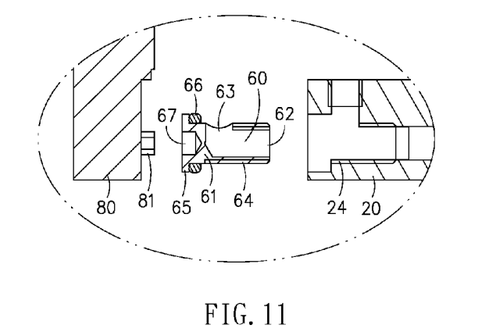
FIG. 11 is an enlarged view of area G of FIG. 7.

Refer now to FIG. 7, FIG. 10 and FIG. 11, in which FIG. 7 demonstrates two second connecting members 60 located to two opposing ends of the combination of the first electrode 20 and the second electrodes 30, FIG. 10 illustrates a connection of the second connecting member 60 and the first electrode 20 in an enlarged view of an assembled state, and FIG. 11 demonstrates an exploded view of the connection. The second connecting member 60 structured as a short hollow pipe has a sealing end 61, a second open end 62 opposing to the sealing end 61, a penetration hole 63 located at a middle portion thereof to face the conjunction of the third electrode 40 and the first electrode 20, and an external thread 64 located close to the second open end 62 for engaging the internal thread 24 of the first electrode 20 (or in another side of FIG. 7, the external thread 64 located close to the second open end 62 for engaging the internal thread 34 of the second electrode 30). As shown in FIG. 7, the second open end 62 of the second connecting member 60 is screwed into the first electrode 20 at the end of the first electrode 20 opposing to the end thereof engaging the first connecting member 50. In addition, the sealing end 61 of the second connecting member 60 includes an external circumferential flange 65 and a washer 66 located close to the flange 65 by disposing between the flange 65 and the penetration hole 63.

Figure 4:
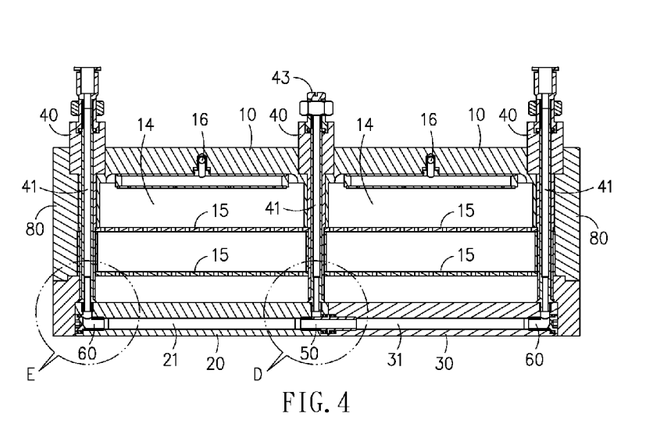
FIG. 4 is a cross-sectional view of FIG. 1 along line A-A.
Figure 5:
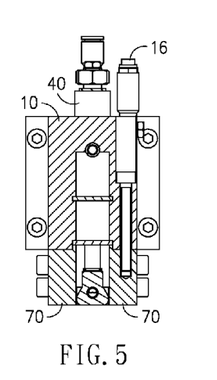
FIG. 5 is a cross-sectional view of FIG. 1 along line B-B.
Figure 6:
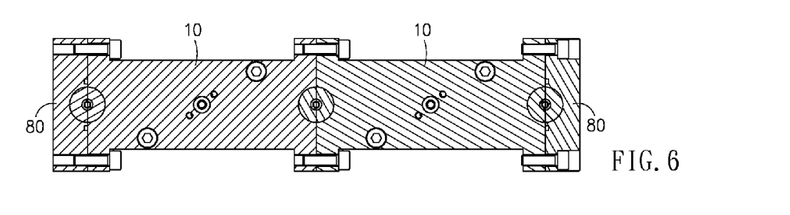
FIG. 6 is a cross-sectional view of FIG. 1 along line C-C.

In this embodiment, the first electrode 20, the second electrode 30, the third electrode 40, the first connecting member 50 and the second connecting member 60 are all hollow parts. Upon such an arrangement, a connecting internal flow channel can be established for conveying cooling medium. Referring to FIG. 4, the cooling medium can be introduced from the third electrode 40 at the left hand side, then flow in order through the third flow channel 41 at the left hand side, the second connecting member 60 at the left hand side, the first flow channel 21, the first connecting member 50, the second flow channel 31, the second connecting member 60 at the right hand side and the third flow channel 41 at the right hand side, and finally leave the device from the third electrode 40 at the right hand side. Similarly, in a reverse manner, the flow medium can be introduced from the third electrode 40 at the right hand side and leave from the third electrode 40 at the left hand side. For the existence of the washers 55 (FIG. 9) and 66 (FIG. 11) respectively at the first connecting member 50 and the second connecting member 60, thus the flow of the medium can be substantially prevented from leakage. Further, in FIG. 4, a screw bolt 43 is applied to seal the top of the middle third electrode 40 so as to make the middle third electrode 40 to perform only as an electrode not for flowing the cooling medium.

Importantly, in the case that no cooling medium is required, then the first electrode 20, the second electrodes 30, the third electrode 40, the first connecting member 50 and the second connecting member 60 can be alternatively made as solid parts. In particular, even in the situation of applying no cooling medium, the first electrode 20, the second electrodes 30, the third electrode 40, the first connecting member 50 and the second connecting member 60 can be also made as hollow parts.

Referring now to FIG. 1, FIG. 4, FIG. 7 and FIG. 11, a lateral plate 80 can be provided to each opposing side of the in-serial combination of the first electrode 20 and the second electrode 30. The lateral plate 80 further includes a protrusion 81 facing the respective second connecting member 60, while the second connecting member 60 further includes a respective cavity 67 to receive the protrusion 81. By having the protrusion 81 to mate the cavity 67, an anchoring effect can be achieved, and both sides of the three third electrodes 40 can be protected by the corresponding lateral plates 80.

Figures 1, 2:
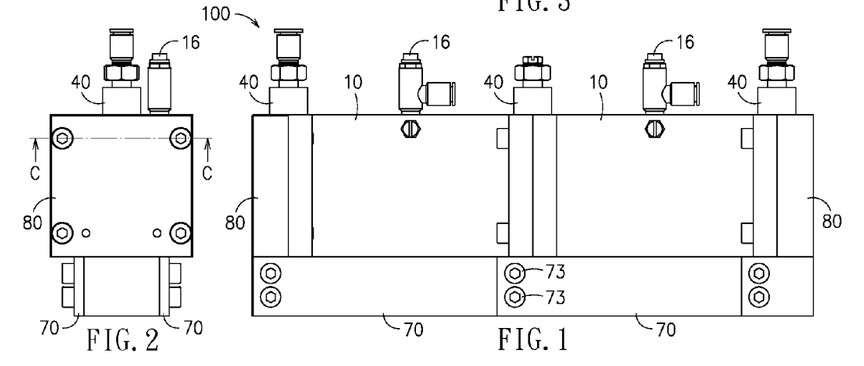
FIG. 1 is a front view of an embodiment of the modular electrode device in accordance with this present disclosure.
FIG. 2 is a lateral left-hand-side view of FIG. 1.
Figure 3:
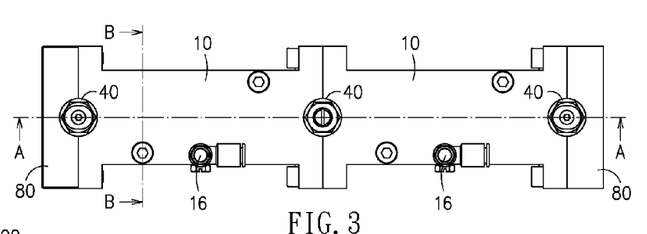
FIG. 3 is a top view of FIG. 1.
Figure 12:
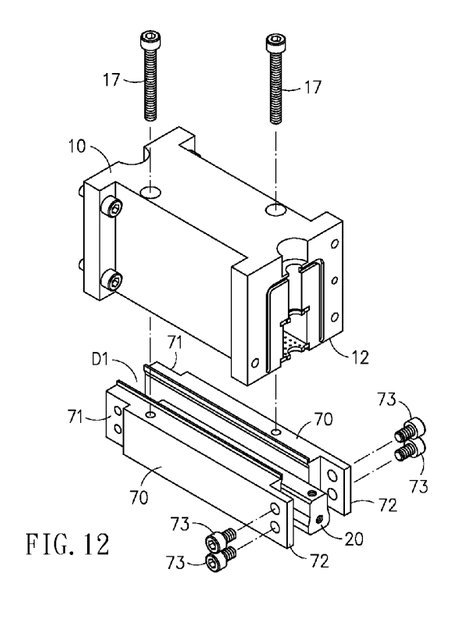
FIG. 12 is a schematic exploded view of the main body, the beam body and the electrode of FIG. 1.
Figure 13:
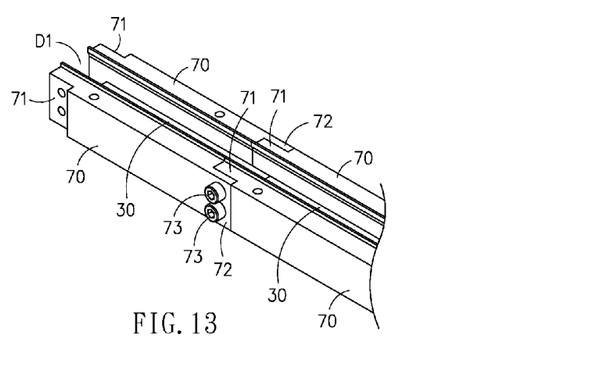
FIG. 13 illustrates schematically the connection of two beam bodies of the embodiment of this disclosure.

Referring now to FIG. 1, FIG. 12 and FIG. 13, the second side edge 12 of the main body 10 can further include two beam bodies 70 disposed in a symmetric manner. The main body 10 can integrate the two beam bodies 70 with screw bolts 17. These two beam bodies 70 is spaced by a distance D1 for producing a room to accommodate the first electrode 20 and the second electrodes 30. Two opposing ends of the pair of the beam bodies 70 are formed to be a necking end 71 and a nesting end 72. Upon such an arrangement, the nesting end 72 of the two beam bodies 70 of this current main body 10 can mate the necking end 71 of another two beam bodies 70 of a neighboring main body 10 so as to integrate these two main bodies 10. As shown in FIG. 13, the engagement of the necking end 71 and the nesting end 72 can be further ensured by screw bolts 73. It is obvious that, in this disclosure, the setup of the necking end 71 and the nesting end 72 can contribute to an easy in-serial combination of plural main bodies 10, such that the extension of the device in series can be promptly and also provide substantial structural stability.

Figure 14:
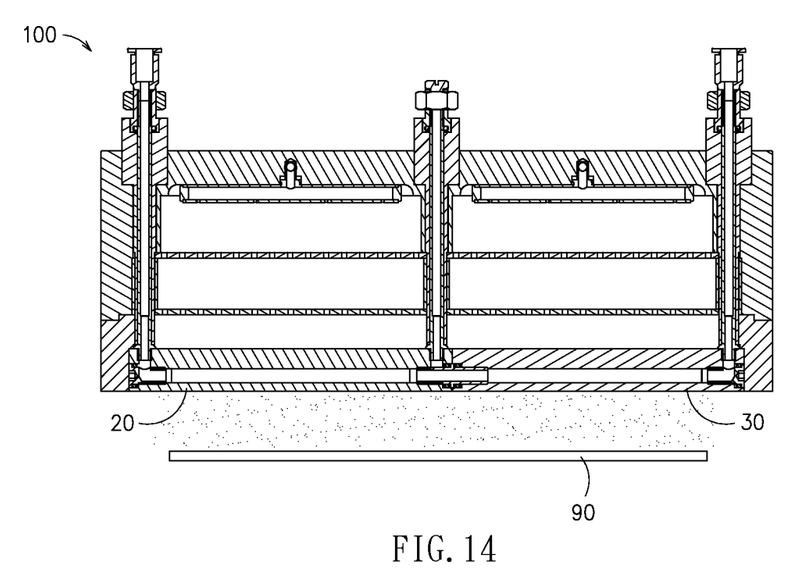
FIG. 14 shows schematically an application of the embodiment of FIG. 1 to a base plate.

Referring now to FIG. 14, the modular electrode device 100 of this disclose can be applied to the plasma surface treatment or the plasma coating process. By placing a base plate 90 to a side of the first electrode 20 and second electrode 30, and further by energizing the modular electrode device 100, a plasma can then be produced from the first electrode 20 and the second electrode 30 and hit the surface of the base plate 90 so as to perform predetermined surface treatment or coating.

Figure 15:
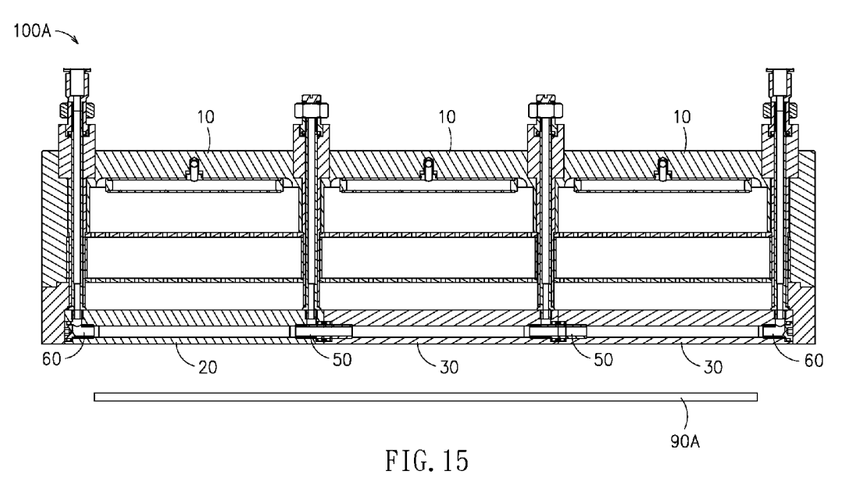
FIG. 15 shows schematically another application of the embodiment of FIG. 1 to another base plate.

Referring now to FIG. 15, another embodiment of the modular electrode device 100A is demonstrated to include three main bodies 10, in which the main body 10 at the left hand side has a first electrode 20, while the other two main bodies 10 have individual second electrodes 30. Hence, this embodiment 100A can handle a larger base plate 90A. Similarly, more than three main bodies 10 with an appropriate number of second electrodes 30 and arranged in a series manner can thus be conveniently and promptly extended for processing an even much larger base plate.

Figure 16:
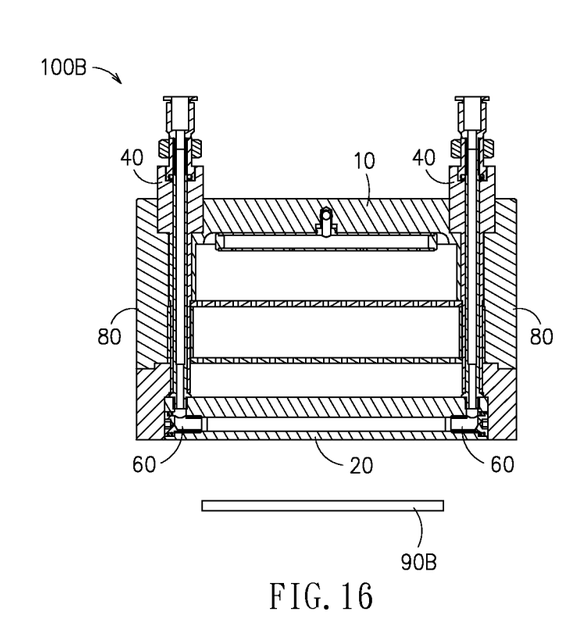
FIG. 16 shows schematically a further application of the embodiment of FIG. 1 to a further base plate.

Referring now to FIG. 16, a further embodiment of the modular electrode device 100B in accordance with the present disclosure is shown to apply only a single main body 10 having a first electrode 20, two third electrodes 40 and two lateral plates 80. Two second connecting members 60 are applied to opposing ends of the first electrode 20. From this embodiment, it implies that the minimum-size electrode device having a single main body 10 can be well formed to handle a smaller base plate 90B. In the case that a larger base plate is waited to be processed, an extended electrode device can be formulated simply by removing one of the lateral plate 80 and then connecting in series another main body 10 (forming the device of FIG. 1) or main bodies 10 (forming the device of FIG. 15 for example). Definitely, in such an extension, relevant numbers of the second electrodes, the third electrode and the first connecting member shall be included. In this disclosure, the aforesaid base plates 90, 90A, 90B can be made of a metal, a non-metal, a conductor or a dielectric material.

Figure 17:
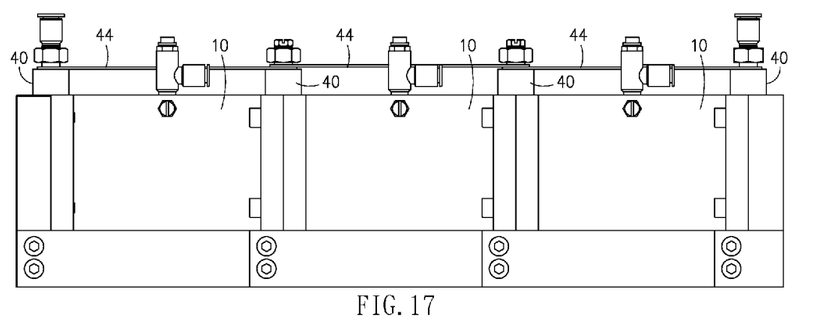
FIG. 17 is a front view of the embodiment of FIG. 15 and the accompanying connection parts in accordance with the present disclosure.
Figure 18:
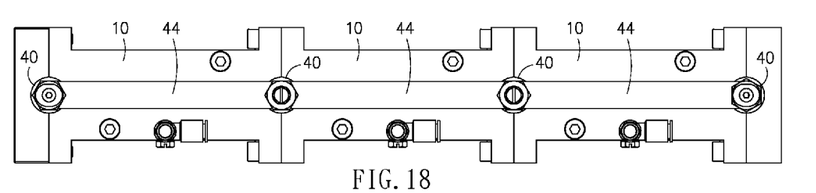
FIG. 18 is a top view of FIG. 17.

Referring now to FIG. 15, FIG. 17 and FIG. 18, in this embodiment, the end of the third electrode 40 that connects the first electrode 20 or the second electrodes 30 can protrude over the respective main body 10. A connection part 44 is applied to connect the protrusive ends of the neighboring third electrodes 40. In this disclosure, the connection part 44, the first electrode 20, the second electrodes 30, the third electrode 40, the first connecting member 50 and the second connecting member 60 can be all made of the same dielectric material so as to form an integrated electric conductive structure.

In summary, the modular electrode device in accordance with the present disclosure is in-serially extendable in a modularization manner through adequate arrangements in conjunction mechanisms, such that various needs in different sizes of work pieces can be satisfied. Further, the plasma provided by the device of this disclosure can be evenly distributed. In addition, the common material (dielectric material) used for major parts of the device can avoid possible leakage of the cooling medium, and can also ensure the electrical coupling of the electrodes. Besides the advantage in having a broader and more quick-changeable working range, the modular electrode device of the present disclosure can also perform selective local plasma management so as to achieve merits of flexible manufacturing. At the same time, the problem in acquiring the large-size heat-resistant insulating material can also be overcome by introducing the modular electrode device in accordance with the present disclosure. Apparently, the device provided in this disclosure can be suitable to process large-size base plates, including surface cleaning, activating, reducing, coating and so on. Also, due to no need of the expensive large-size heat-resistant insulating material such as the 1-m PEEK, Teflon or Ceramics, the price for the device of this disclosure is thus competitive.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A modular electrode device, comprising:
a plurality of main bodies, each of the main bodies having a first side edge, a second side edge and a third side edge, the second side edge being located between the first side edge and the third side edge;
a first electrode, mounted at the second side edge of one of the main bodies;
at least one second electrode, each of the at least one second electrode being mounted at another one said second side edge of the corresponding one said main body, the at least one second electrode being in-serially located to one end of the first electrode;
a plurality of third electrodes, located to separate the plurality of main bodies, the plurality of third electrodes, the first electrode and the at least one second electrode being coupled with each other;
at least one first connecting member, located between the first electrode and the second electrode so as to connect in-serially the first electrode and the second electrode; and
two second connecting members, located respectively to two opposing sides of a combination of the first electrode and the at least one second electrodes.

2. The modular electrode device of claim 1, wherein the first connecting member further includes an external threaded section and a plug section, the first electrode further having an internal thread to engage the external threaded section, the plug section being plugged tightly to the respective second electrode.

3. The modular electrode device of claim 2, wherein the second connecting member further has an external thread to engage another internal thread of the first electrode.

4. The modular electrode device of claim 1, wherein the first connecting member further includes a flange and two washers located to two opposing sides of the flange.

5. The modular electrode device of claim 1, wherein the second connecting member further has a sealing end including a circumferential end flange and a washer located to one side of the circumferential end flange.

6. The modular electrode device of claim 1, wherein the first electrode further has a first channel communicative in space to both opposing ends thereof, the second electrode further has a second channel communicative in space to both opposing ends thereof, and the third electrode further has a third channel communicative in space to both opposing ends thereof.

7. The modular electrode device of claim 1, wherein the first connecting member shaped as a hollow pipe has two opposing first open ends to be located respectively into the first electrode and the second electrode, and the second connecting member shaped as another hollow pipe has a sealing end, a second open end opposing to the sealing end, and a penetration hole located at a middle portion thereof to face a conjunction of the third electrode and the first electrode.

8. The modular electrode device of claim 1, wherein a lateral plate is provided to each opposing side of an in-serial combination of the first electrode and the second electrode, the lateral plate further including a protrusion facing the respective second connecting member to mate a cavity of the respective second connecting member.

9. The modular electrode device of claim 1, wherein one end of the third electrode further includes an external thread to engage a corresponding internal thread of the respective one of the first electrode and the second electrode.

10. The modular electrode device of claim 1, wherein the second side edge of the main body further include two beam bodies disposed in a symmetric manner and separated by a distance for producing a room to accommodate the first electrode and the second electrode, two opposing ends of a pair of the beam bodies being formed to be a necking end and a nesting end, the nesting end of the two beam bodies of one current main body mating the necking end of another two beam bodies of a neighboring main body.

11. The modular electrode device of claim 1, wherein the third electrode that connects the first electrode or the second electrode further has a protrusive end over the respective main body, and a connection part is included to connect all the protrusive ends of the neighboring third electrodes.

* * * * *